(12) United States Patent
Liu

(10) Patent No.: US 7,005,750 B2
(45) Date of Patent: Feb. 28, 2006

(54) SUBSTRATE WITH REINFORCED CONTACT PAD STRUCTURE

(75) Inventor: Sheng-Tsung Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/902,003

(22) Filed: Jul. 30, 2004

(65) Prior Publication Data
US 2005/0023679 A1 Feb. 3, 2005

(30) Foreign Application Priority Data
Aug. 1, 2003 (TW) .............................. 92121210 A

(51) Int. Cl.
*H01L 23/48* (2006.01)
(52) U.S. Cl. ...................................... 257/779; 257/775
(58) Field of Classification Search ................ 257/773, 257/775, 779, 780, 781
See application file for complete search history.

(56) References Cited

U.S. PATENT DOCUMENTS

| | | | | |
|---|---|---|---|---|
| 5,519,580 A * | 5/1996 | Natarajan et al. | ........... | 361/760 |
| 5,764,485 A * | 6/1998 | Lebaschi | ..................... | 361/774 |
| 5,844,782 A * | 12/1998 | Fukasawa | ................... | 361/774 |
| 6,028,366 A * | 2/2000 | Abe | ............................ | 257/779 |
| 6,046,410 A * | 4/2000 | Wojnarowski et al. | ...... | 174/262 |
| 6,125,043 A * | 9/2000 | Hauer et al. | ................. | 361/760 |
| 6,201,305 B1 * | 3/2001 | Darveaux et al. | ........... | 257/779 |
| 6,259,038 B1 * | 7/2001 | Sakaguchi et al. | .......... | 174/261 |
| 6,324,754 B1 * | 12/2001 | DiStefano et al. | ............ | 29/840 |
| 6,329,605 B1 * | 12/2001 | Beroz et al. | ................. | 174/256 |
| 6,441,316 B1 * | 8/2002 | Kusui | ......................... | 174/260 |
| 6,448,504 B1 * | 9/2002 | Taguchi | ...................... | 174/255 |
| 6,472,608 B1 * | 10/2002 | Nakayama | ................... | 174/255 |
| 6,731,511 B1 * | 5/2004 | Yuzawa | ...................... | 361/760 |
| 6,762,503 B1 * | 7/2004 | Lee | ............................. | 257/781 |
| 6,853,091 B1 * | 2/2005 | Miyajima | ................... | 257/786 |
| 2002/0086144 A1 * | 7/2002 | Honda et al. | ............... | 428/209 |

FOREIGN PATENT DOCUMENTS

TW 441059 6/2001

* cited by examiner

*Primary Examiner*—Matthew Smith
*Assistant Examiner*—Lex H Malsawma
(74) *Attorney, Agent, or Firm*—Troxell Law Office, PLLC

(57) ABSTRACT

A substrate with reinforced contact pad structure includes a metal wiring layer and a solder mask formed over its surface. The metal wiring layer includes at least a NSMD (Non-Solder Mask Defined) type contact pad, a trace and an extension. The extension connects the contact pad and the trace, and has an upper surface which is covered by the solder mask so as to enhance the connecting strength between the trace and the contact pad and to improve the position stability of the NSMD type contact pad on the substrate. In an embodiment, the contact pad is circular for bonding a bump or a solder ball. The first extension is fan-shaped. The extension also has a sidewall exposed out of the solder mask.

12 Claims, 4 Drawing Sheets

SUBSTRATE WITH REINFORCED CONTACT PAD STRUCTURE

FIELD OF THE INVENTION

The present invention relates to a substrate for semiconductor package, more particularly, to a substrate with non-solder mask defined (NSMD) contact pads.

BACKGROUND OF THE INVENTION

Conventionally in the substrate with circuit design such as printed circuit boards, flex printed circuit boards, and packaging substrate, contact pads for electrical connection are formed on the surface of these substrates such as aluminum pads or copper pads. By means of bumping, solder ball placement or solder paste printing, contact pads are used for bonding an exterior electrical component, such as flip chip, printed circuit board, or passive component. There are two kinds of contact pads on the substrate, SMD (Solder Mask Defined) and NSMD (Non-Solder Mask Defined), where the dimension of the SMD contact pads are larger than the openings of the solder mask and the dimension of the NSMD contact pads are smaller than the openings of the solder mask, moreover, the edge of the NSMD contact pads will not be covered by the solder mask. For SMD contact pads, the exposed area of the contact pads is defined by the solder mask to improve the fixing ability of contact pads on the substrate. However, since the edge of the opening of the solder mask will contact with bumps, solder balls or solder paste, therefore, bumps, solder balls or solder paste will experience extra stress from the solder mask which will cause poor adhesion or even failure which is revealed in Taiwan Patents No. 441059. For NSMD contact pads, the upper surfaces and the sidewalls of the contact pads are free from solder mask which can improve the wettability of solder balls or solder paste.

As shown in FIGS. 1 and 2, a conventional substrate 10 is disclosed that has a plurality of NSMD contact pads 20 thereon. Each contact pad 20 has a circular bonding surface 21 and a sidewall 22. Each contact pad 20 is connected with a trace 30 of metal wiring layers on same surface. The solder mask 40 is applied on the surface of the substrate 10 and has a plurality of openings 41. The openings 41 are larger than the contact pads 20 and expose the bonding surfaces 21 and the corresponding sidewalls 22 of the contact pads 20 for bumping, solder balls placement or solder paste printing. However, as shown in FIG. 1 the connecting ends 31 of the traces 30 which are connected to the NSMD contact pads 20 are also exposed out of the openings 41 of the solder mask 40. Any external stress or force experienced on the contact pads 20 also directly impact the exposed connecting ends 31 of the traces 30. This will easily cause the traces 30 to break or electrically fail. Moreover, because contact pads 20 are completely exposed out of the solder mask 40, therefore, the positions of contact pads 20 on the substrate 10 may be shifted which will cause alignment problems in the following assembly processes and the assembly yield will be low.

SUMMARY OF THE INVENTION

The main purpose of the present invention is to provide a substrate with reinforced contact pad structure. An extension is extended from a NSMD contact pad on a substrate. Moreover, the extension connects a trace and has an upper surface which is covered by a solder mask to improve the connection strength between the trace and the NSMD contact pad and to improve the position stability of NSMD contact pad on the substrate.

The second purpose of the present invention is to provide a substrate with reinforced contact pad structure. An extension connecting a NSMD contact pad and an extensive gap of the solder mask opening are formed on the substrate in the staggered layout where the extensive gap exposes the sidewalls of the extension and the contact pad to compensate the area reduction of sidewall of the NSMD contact pad connected by the extension and to increase the reliability of electrical connection of bump, solder ball or solder paste.

According to the present invention, a substrate with the reinforced contact pad structure is provided, including a substrate, a metal wiring layer, and a solder mask. The metal wiring layer is disposed on the surface of the substrate and includes at least a contact pad, a trace and at least an extension connecting the contact pad and the trace. The contact pad has a bonding surface and a sidewall. The solder mask is formed over the surface of the substrate to cover the upper surface of the extension and the trace. The solder mask has at least an opening to expose the bonding surface and the sidewall of the contact pad. Preferably, the sidewall of the extension is also exposed out of the opening of the solder mask. Thus the extension connects the trace and has the upper surface covered by the solder mask to improve the connection strength between the trace and the contact pad and to improve the position stability of the contact pad on the substrate.

DETAIL DESCRIPTION OF THE INVENTION

Figure 1:
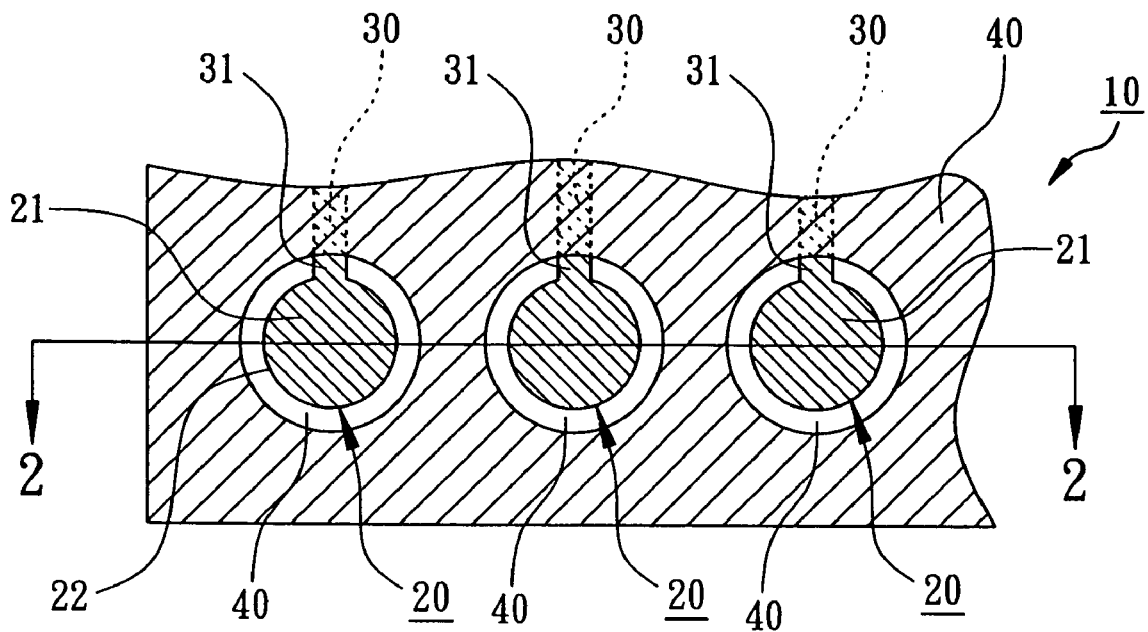
FIG. 1 is a partial top view of a conventional substrate with a NSMD contact pad.
Figure 2:
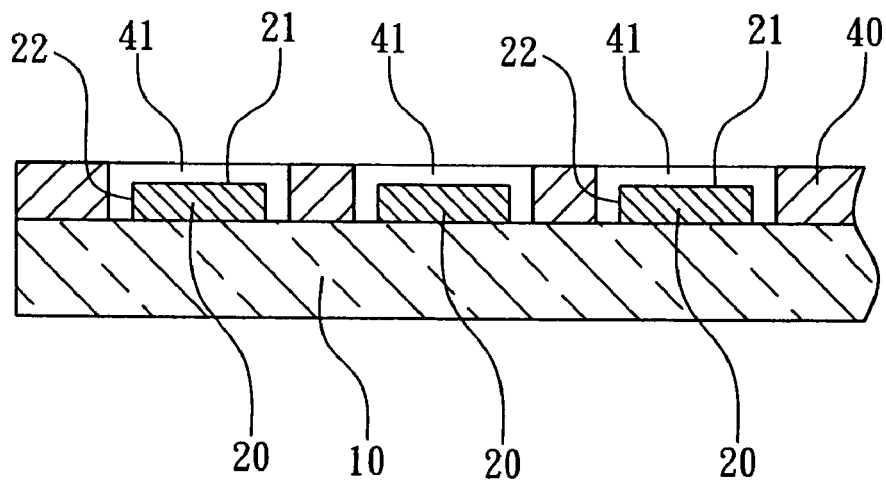
FIG. 2 is a cross-sectional view of the conventional substrate along the 2—2 line in FIG. 1.
Figure 3:
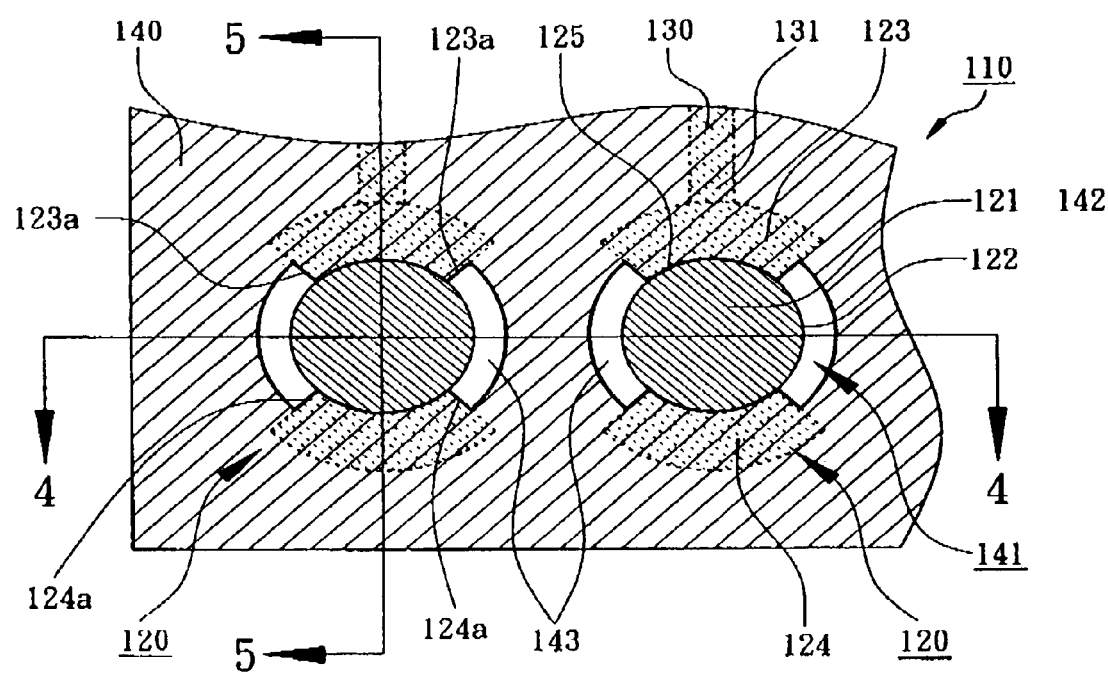
FIG. 3 is a partial top view of a substrate with reinforced contact pad structure according to the present invention.
Figure 4:
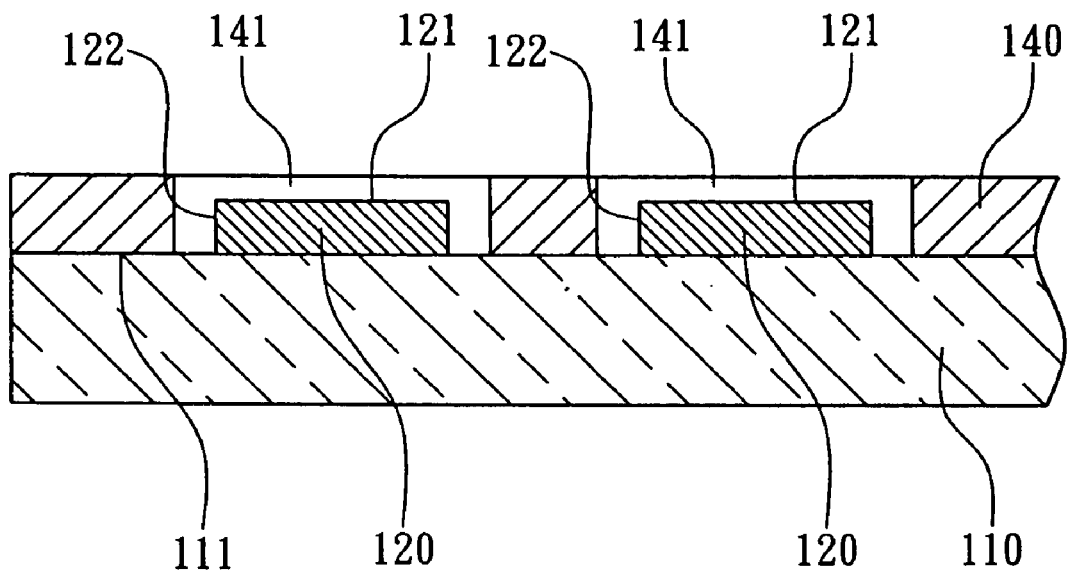
FIG. 4 is a cross-sectional view of the substrate along the 4—4 line in FIG. 3 according to the present invention.
Figure 5:
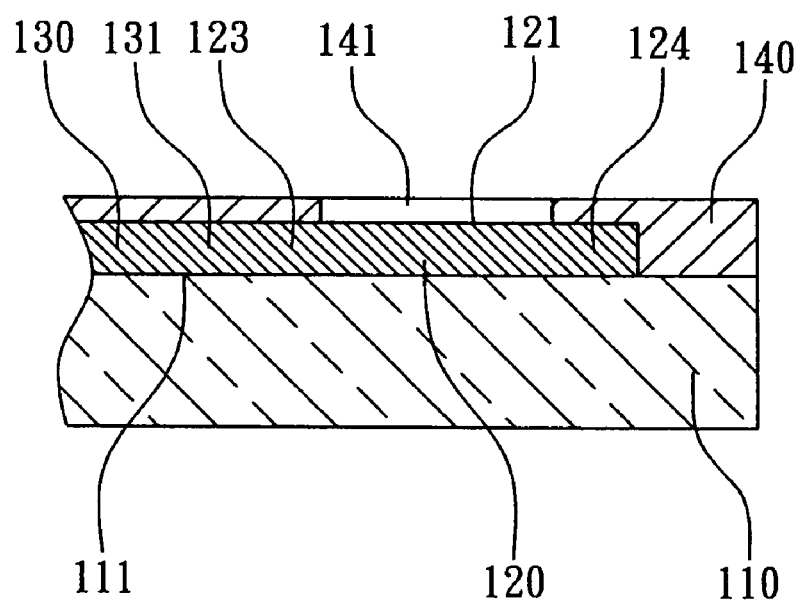
FIG. 5 is a cross-sectional view of the substrate along the 5—5 line in FIG. 3 according to the present invention.
Figure 6:
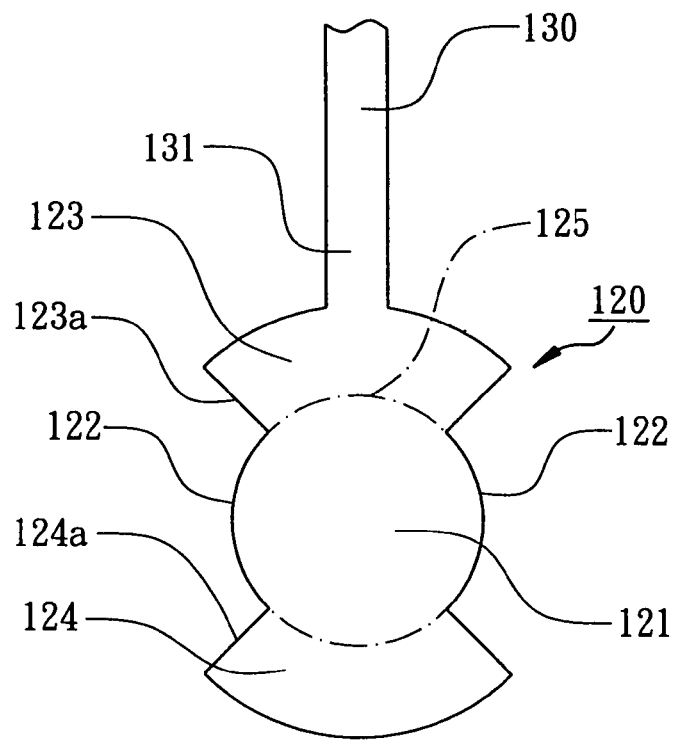
FIG. 6 is a top view of the contact pad on the substrate according to the present invention.

Please refer to the drawings attached, the present invention will be described by means of an embodiment below. According to an embodiment of the present invention, a substrate with reinforced contact pad structure is shown in FIGS. 3, 4, and 5. It mainly comprises a substrate 110, a metal wiring layer, and a solder mask 140. The metal wiring layer includes at least a contact pad 120, a trace 130, and at least a first extension 123. As shown in FIG. 6, the first extension 123 connects the contact pad 120 and the trace 130. The substrate 110 comprises a resin layer with circuits design, not shown in the figures. The substrate 110 has a surface 111 for SMT connection.

Referring to FIGS. 4 and 5, the metal wiring layer including the contact pad 120, the trace 130 and first extension 123 is disposed on the surface 111 of the substrate 110. Referring to FIGS. 4 and 6, the contact pad 120 has a bonding surface 121 and a sidewall 122. There is a V-shaped indentation between the sidewall 123a of the first extension 123 and the sidewall 122 of the contact pad 120. According to the present embodiment, the metal wiring layer further includes a second extension 124 which connects the contact pad 120 opposing to the first extension 123. Preferably, the sidewall 122 is perpendicular to the bonding surface 121 as shown in FIG. 4. The bonding surface 121 and the sidewall 122 of the contact pad 120 are exposed out of the opening 141 of the solder mask 140 for solder wetting. Therefore, the contact pad 120 is a NSMD pad possessing the character of better solder ball wettability. In this embodiment, the bonding surface 121 is a circle in shape for placing a solder ball or a bump in a larger contact area. The first extension 123 and the second extension 124 are fan-shaped as shown in FIG. 6. Moreover, the first extension 123 connects the end 131 of the trace 130. Referring to FIG. 3, the upper surface of the first extension 123, the upper surface of the second extension 124 and the trace 130 are covered by the solder mask 140. Therefore, the end 131 of the trace 130 will not be exposed out of the opening 141 of the solder mask 140. Furthermore, the first extension 123 has a border 125 along the opening 140 is longer than the width of the trace 130. The border 125 is about 10 to 30% of the periphery of the opening 141 of the solder mask 140 so that the external stress or rework tensile or compression experienced on the bonding surface 121 will not directly impact the trace 130. Moreover, the contact pad 120 can firmly connect to the substrate 110 without any alignment shift. Therefore, the reliability of electrical connection between the trace 130 and the NSMD type contact pad 120 can be greatly enhanced. In the present embodiment, the first extension 123 is fan-shaped and is symmetric to the second extension 124 which is also covered by the solder mask 140 to further improve the position stability of the NSMD type contact pad 120 on the substrate 110.

Figure 7:
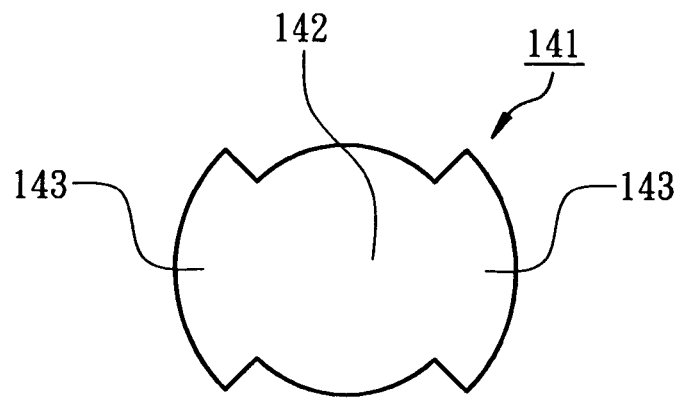
FIG. 7 is a top view of the opening of the solder mask on the substrate according to the present invention.

Referring to FIGS. 3 and 7, the solder mask 140 acts as insulation for solder balls or solder paste which has an opening 141 corresponding to the contact pad 120. Referring to FIGS. 3 and 4, the opening 141 is larger than the contact pad 120 to expose the bonding surface 121 and the sidewall 122. However the solder mask 140 covers the upper surfaces of the first extension 123 and the second extension 124. In the present embodiment, the opening 141 of the solder mask 140 includes a circular opening 142 and at least an extensive gap 143 in fan-shaped, please refer to FIGS. 3 and 7. The extensive gap 143 is formed in staggered layout corresponding to the first extension 123 and the second extension 124. Therefore, the extensive gap 143 can partially expose the sidewall 123a of the first extension 123 and the sidewall 124a of the second extension 124 to compensate the area reduction of the sidewall 122 of the contact pad 120. The trace 130 is completely sealed by the solder mask 140 by means of the shape of the first extension 123.

Therefore, according to the present invention, the trace 130 will be not directly connected to the NSMD type contact pad 120 because of the first extension 123 covered by the solder mask 140. There is no exposed portion of the trace 130 out of the opening 141 of the solder mask 140. The connecting strength between the trace 130 and the NSMD type contact pad 120 will be greatly enhanced. The substrate mentioned in the present invention is specially designed for a packaging substrate with ball grid array. The NSMD contact pad 120 has the circular exposed bonding surface 121 and the sidewall 122 for bumping or solder ball placement. Moreover, the position stability and reliability of the NSMD type contact pad 120 on the substrate 110 is greatly enhanced by the symmetrical design of the first extension 123 and the second extension 124 which are covered by the solder mask 140. Since the end 131 of the trace 130 is fully covered by the solder mask 140, therefore, the reliability of the NSMD contact pad 120 will be greatly enhanced to resist any external stress of the solder balls and increase the yield of the assembly processes.

The above description of embodiments of this invention is intended to be illustrative and not limiting. Other embodiments of this invention will be obvious to those skilled in the art in view of the above disclosure.

What is claimed is:

1. A substrate with reinforced contact pad structure, comprising:
   a substrate having a surface;
   a metal wiring layer disposed on the surface of the substrate, the metal wiring layer including at least a contact pad, a trace and a first extension connecting the contact pad and the trace, the contact pad having a bonding surface and a sidewall; and
   a solder mask formed over the surface of the substrate, the solder mask having at least an opening;
   wherein the bonding surface and the sidewall of the contact pad are exposed out of the opening of the solder mask, the upper surface of the first extension and the trace are covered by the solder mask, wherein the first extension has a border along the opening longer than the width of the trace.

2. The substrate of claim 1, wherein the opening of the solder mask is larger than the contact pad.

3. The substrate of claim 1, wherein the bonding surface of the contact pad is circular.

4. The substrate of claim 3, wherein the first extension has an arc shape.

5. The substrate of claim 1, wherein the metal wiring layer includes a second extension connecting the contact pad opposing to the first extension, the upper surface of the second extension is covered by the solder mask.

6. The substrate of claim 1, wherein the first extension has a sidewall exposed out of the opening.

7. The substrate of claim 1, wherein there is a V-shaped indentation between the sidewalls of the contact pad and the first extension.

8. The substrate of claim 1, wherein the contact pad is a Non-Solder Mask Defined pad.

9. The substrate of claim 1, wherein the first extension has a shape in a manner that the trace is completely sealed by the solder mask.

10. A substrate with reinforced contact pad structure, comprising:
    a substrate having a surface;
    a metal wiring layer disposed on the surface of the substrate, the metal wiring layer including at least a contact pad, a trace and a first extension connecting the contact pad and the trace, the contact pad having a bonding surface and a sidewall; and
    a solder mask formed over the surface of the substrate, the solder mask having at least an opening;
    wherein the bonding surface and the sidewall of the contact pad are exposed out of the opening of the solder mask, the upper surface of the first extension and the trace are covered by the solder mask, wherein the opening of the solder mask includes a circular opening correspond to the bonding surface and at least an extensive gap, the extensive gap is formed in staggered layout corresponding to the first extension to expose the sidewall of the contact pad.

11. The substrate of claim 10, wherein the first extension has a sidewall exposed out of the extensive gap.

12. The substrate of claim 10, wherein the extensive gap has an arc shape.

* * * * *